United States Patent
Wu et al.

(10) Patent No.: US 8,050,643 B1
(45) Date of Patent: Nov. 1, 2011

(54) RF-AGC SCHEME INSENSITIVE TO CHANNEL INTERFERENCE AND DEEP FADING

(75) Inventors: Songping Wu, Sunnyvale, CA (US); Hua Qian, Fremont, CA (US); Gang Liu, Fremont, CA (US); King Chun Tsai, San Jose, CA (US); Lawrence Tse, Fremont, CA (US); Hui-Ling Lou, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 845 days.

(21) Appl. No.: 12/118,357

(22) Filed: May 9, 2008

Related U.S. Application Data

(60) Provisional application No. 60/916,943, filed on May 9, 2007.

(51) Int. Cl.
    *H04B 7/00* (2006.01)

(52) U.S. Cl. ...................................... 455/234.1; 455/254

(58) Field of Classification Search ............... 455/232.1, 455/234.1, 234.2, 246.1, 247.1, 250.1, 254; 375/345
See application file for complete search history.

(56) References Cited

U.S. PATENT DOCUMENTS

| | | | |
|---|---|---|---|
| 5,877,909 A * | 3/1999 | Ko et al. | 360/40 |
| 7,577,414 B2 * | 8/2009 | Mehr | 455/234.1 |
| 7,773,014 B1 * | 8/2010 | Wu et al. | 341/139 |

* cited by examiner

*Primary Examiner* — Nguyen Vo
(74) *Attorney, Agent, or Firm* — Marshall, Gerstein & Borun LLP

(57) ABSTRACT

In a method and system for controlling gain in an RF receiver, an RF signal is analyzed over different attack and decay windows, from which the receiver determines (1) if the signal is in an attack condition with dip values below a threshold level thus indicating a need for increasing signal gain, or (2) if the signal is in a decay condition with threshold values above a threshold level thus indicating a need for decreasing signal gain. The receiver applies attack and decay windows of different sizes and in an asynchronous manner to create a gain control scheme that is insensitive to transient effects such as channel interference and deep fading that affect the intensities of an in-band signal.

34 Claims, 19 Drawing Sheets

RF-AGC SCHEME INSENSITIVE TO CHANNEL INTERFERENCE AND DEEP FADING

CROSS-REFERENCE TO RELATED APPLICATION

The present application claims the benefit of U.S. Provisional Application No. 60/916,943, entitled "A RF-AGC Scheme Insensitive to Channel Interference and Deep Fading," filed on May 9, 2007, which is hereby incorporated by reference herein in its entirety.

FIELD OF TECHNOLOGY

The present disclosure relates generally to communication devices, and more particularly, to techniques for controlling gain applied to an RF signal.

DESCRIPTION OF THE RELATED ART

Traditionally, to compensate for fluctuations in a radio frequency (RF) signal, a receiver will amplify the received RF signal when a peak detector determines that the signal intensity is below a threshold level. Generally speaking, the receiver uses these peak detection techniques to compensate for channel interference and deep fading. However, simply measuring power of the RF signal at a particular instant and then increasing or decreasing gain may lead to improper gain adjustments. Channel interference and deep fading conditions apply an envelope to the desired in-band signal (i.e., the channel of interest) varying the signal intensity over time, sometimes in a somewhat simple sinusoidal pattern, but many times in a quite complex pattern. Conventional peak detection techniques are not equipped to control gain increases and decreases in a manner that minimizes the effects of this intensity variation.

SUMMARY OF THE DISCLOSURE

In one embodiment, a method for adjusting gain in an receiver comprises; analyzing a signal over a first detection window to determine if a threshold amount of peak values in the signal occur over the first detection window; analyzing the signal over a second detection window to determine if a threshold amount of dip values in the signal occur over the second detection window, wherein the first detection window and the second detection window have different lengths; and adjusting the gain applied to the signal in response to the identification of the threshold amount of peak values occurring in the first detection window or the threshold amount of dip values occurring the second detection window.

In another embodiment, an apparatus for controlling gain in a receiver comprises: a digital counter stage to count values using a dynamic clock signal having a first clock rate or a second clock rate that is slower than the first clock rate; an analog signal detector to produce an analog peak detection value and an analog dip detection value; an analog comparator to compare the analog peak detection value and the analog dip detection the value to an analog reference value, wherein the digital counter stage is to count comparison values of the comparator; a digital comparator to compare an output of the digital counter stage to a high threshold level and to a low threshold level; and a gain control unit to control the gain of the receiver in response to an output from the digital comparator.

DETAILED DESCRIPTION

Techniques are provided for controlling gain while reducing the effects of channel interference and deep fading on RF signals. An RF device may scan a received RF signal in two independent and asynchronized modes: an attack mode and a decay mode. In the attack mode, the RF device may determine if the RF signal strength is too low, in which case gain is increased. In the decay mode, the RF device may determine if the RF signal strength is too high, in which case gain is decreased. Instead of looking at particular instants of time, however, the RF device uses different windows of time for each of these two modes. This allows both absolute and time-based thresholds to be used to assess signal strength and need for gain control. The RF device processing may be performed primarily in the digital domain, which offers lower cost over all analog approaches. In some configurations, the RF device may include an analog comparator and digital peak detector (or counter) that combine to control gain adjustments even for RF channel signals with large signal envelopes and intensity variations. Computational statistics may be used to determine the conditions under which the gain is adjusted, thus avoiding the false triggering problem of peak detectors and the high power-consumption of the time average techniques of power estimators.

Instead, the RF device may count the percentage of signal samples (e.g., 70%, 80%, or 90%) having power levels above or below certain threshold values. From this threshold identification, the RF device may then control RF gain in the device. In some configurations, the RF device addresses channel null conditions where no proper attack or decay has been identified by implementing a state machine that prevents such null conditions from falsely increasing or decreasing gain. To date, the only effective means of controlling a channel null condition were through false trigger and averaging circuitry.

The RF device may use a digital counter as a peak/dip detector during the attack and decay modes to effectively retrace the envelope of the received RF signal. The RF device may trace the uptrend (or rising edge) of a signal envelope at a faster rate (corresponding to an attack window) to determine if the signal strength is too low. Separately, the RF device may trace the downtrend (or falling edge) of that envelope at a slower rate (corresponding to a decay window) to determine if the signal strength is too strong. This type of asymmetry is useful because channel variation or adjacent channel interference (ACI) is likely to create deep fading on the received signals; and it is generally more desirable to increase gain quickly and to decrease gain reluctantly, especially when dips in the gain profile are from channel interference or deep fading. Also, the sizes and start times of the attack window (gain rise) and decay window (gain drop) may be different, because the two modes operate asynchronously.

Figure 1A:
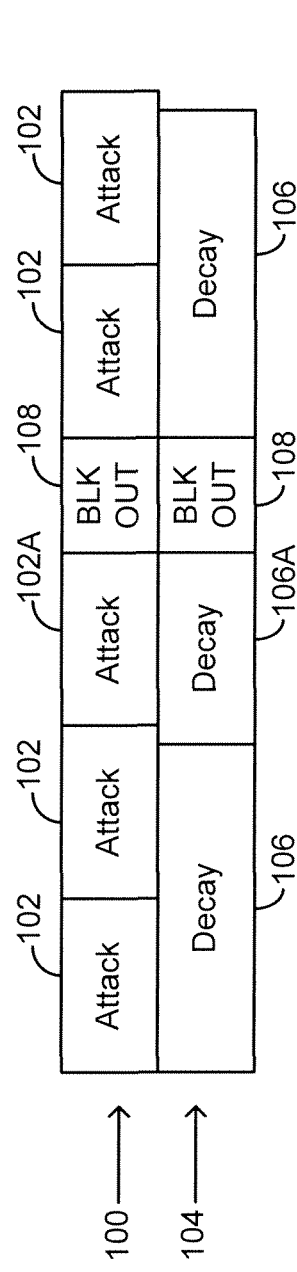
FIGS. 1A-1C are diagrams illustrating various applications of attack and decay modes for analyzing an RF signal in an example.
Figure 1B:
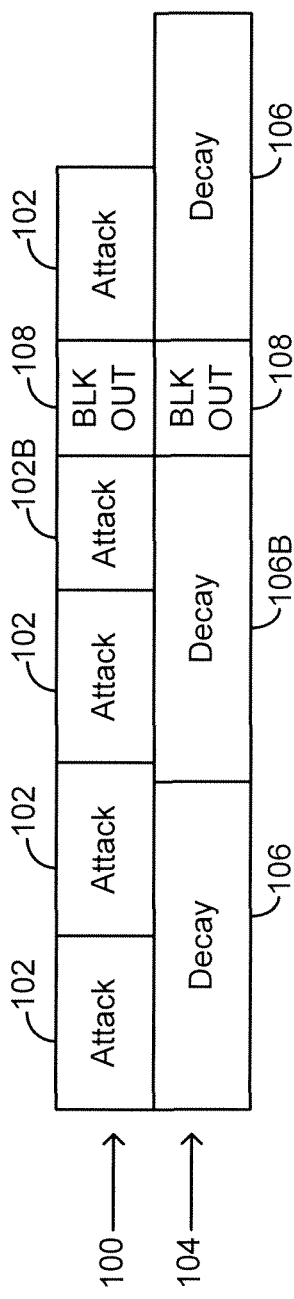
Figure 1C:
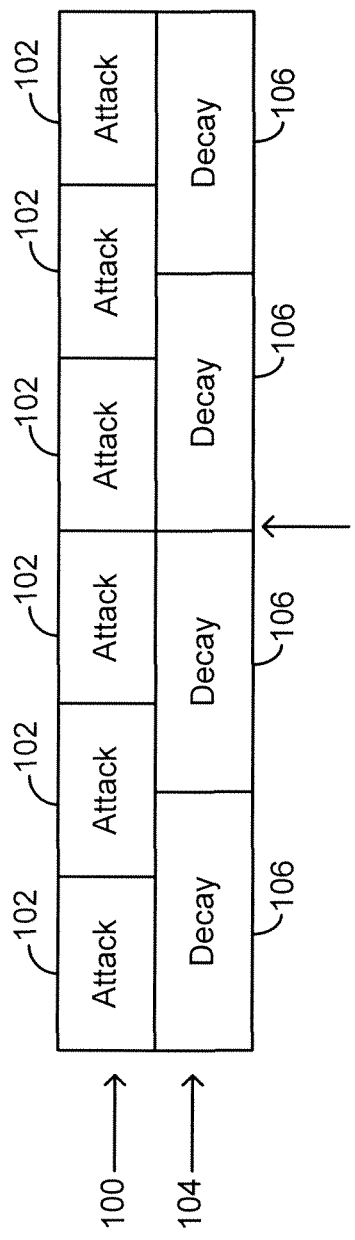

FIGS. 1A-C illustrate example operation of the attack and decay modes. In general, the applied gain is stabilized based on a peak or dip detection count determined over a predetermined window size. In the attack detection mode 100, the RF device analyzes the RF signal over "attack" windows 102 by determining how many (or what percentage of) dip values in the RF signal fall below a low-level intensity threshold ($V_L$). As the attack mode 100 samples the RF signal, if the mode 100 identifies a certain number or percentage of dip values as below the low-level intensity threshold, then the receiver may determine that the RF signal is weak and issue an "attack" signal to raise the gain of the RF gain stage, e.g., an adjustable low noise amplifier (LNA), variable gain amplifier (VGA), or the like. The attack window 102 is repeated during the mode 100 until an attack condition or decay condition is detected. In some examples, the attack window and corresponding gain increase increments are set to levels that seek to avoid over saturating the receiver by applying too much gain.

During a decay detection mode 104, the RF device analyzes the RF signal over "decay" windows 106 by determining how many (or what percentage of) peak values are above a high-level intensity threshold ($V_H$). As the decay mode 104 samples the RF signal, if the mode 104 identifies that a certain number or percentage of peak values are above the high-level threshold, then the receiver may determine that the RF signal is too strong and issue a "decay" signal to lower the gain.

The attack mode 100 and decay mode 104 may operate asynchronously, i.e., with different window sizes and with each window able to start at different times, irrespective of the other. In the illustrated examples, the attack windows are shorter than the decay windows, as it is generally more desirable to identify low signal strengths at a faster rate than high signal strengths. To be flexible, the attack, decay, and blockout windows may have different window sizes and accommodate various requirements for receiver operation. Window size may be programmed prior to operation. However, in other instances, window sizes may be set dynamically based on the average number of decay or attack windows that are sampled before an attack or decay is detected.

The modes 100 and 104 shown in FIGS. 1A and 1B show blockout windows 108 during which further gain detection and adjustment are disabled so that the gain increases or decreases of the system can take effect with spurious false triggering. For example, after an attack or decay detection occurs, the receiver may immediately change the gain, up or down respectively, applied by an RF LNA and send a blocking flag signal to an IF gain stage control instructing it to enter into a blockout mode and stop further gain adjustment by an IF VGA. FIG. 1A shows the detection of an attack condition at the end of an attack window 102A and the subsequent blockout window 108, which stops the decay window 106A. FIG. 1B shows the detection of a decay condition at the end of the decay window 106B and the subsequent blockout window 108, which stops the attack window 102B.

FIG. 1C illustrates how the receiver responds if an attack and decay are detected simultaneously, indicated by the arrow. An RF signal may not be both too strong and too weak at the same time, therefore the receiver is programmed to treat any such simultaneous detection as an ill (or null) condition, from which attack and decay detection modes resume immediately with no blockout window.

Figure 2:
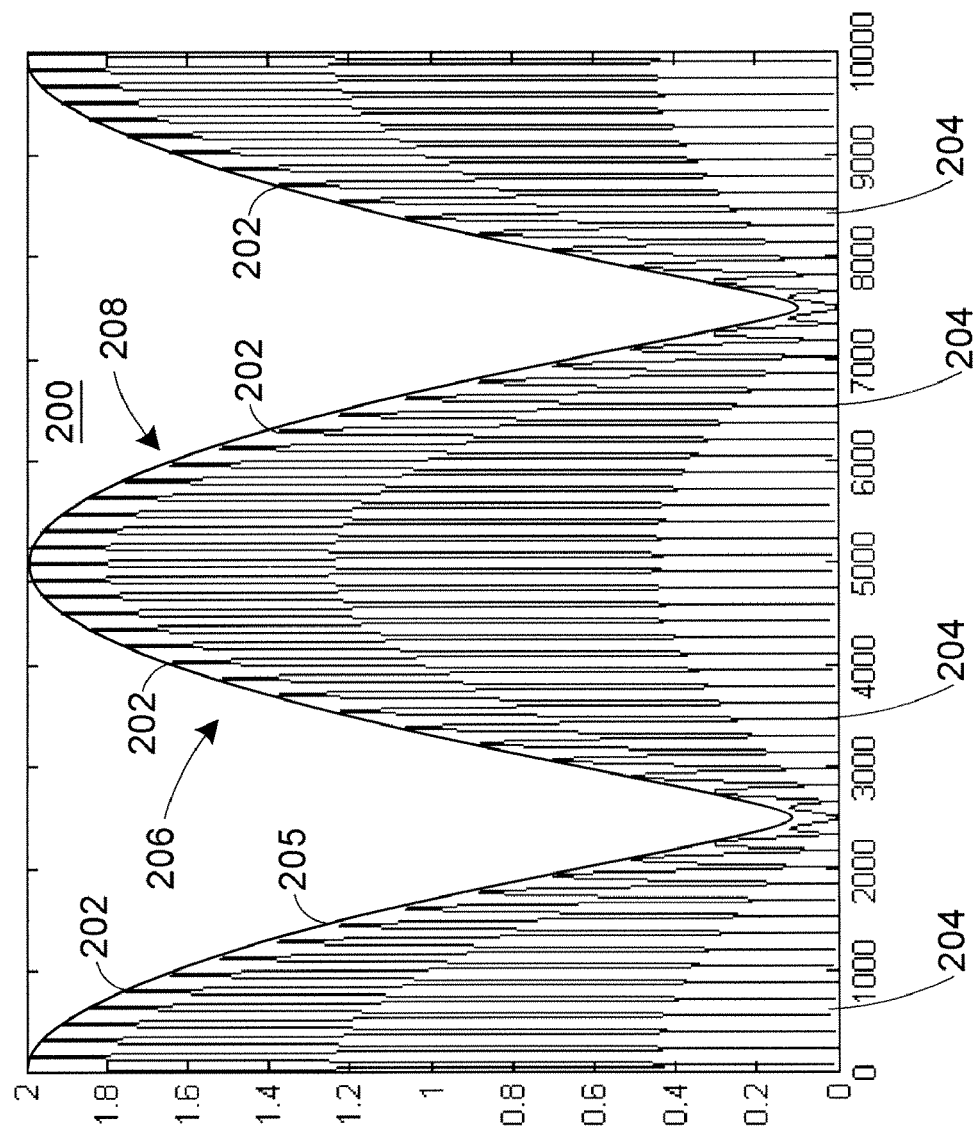
FIG. 2 is a plot of an RF signal experiencing interference.

FIG. 2 shows an example of an RF signal 200 in which the in-band signal (desired) channel has been enveloped by an adjacent channel interference signal of equal power. The result is deep interference notches on the signal envelope as detected by an analog stage peak detector. The signal 200 comprises a plurality of peaks 202 and dips 204 corresponding to the in-band signal (only some of which of numbered in the drawing). Instead of having a constant intensity for these values, an envelope 205 has a rising (or uptrend) portion 206 and a falling (downtrend) portion 208.

Figure 3:
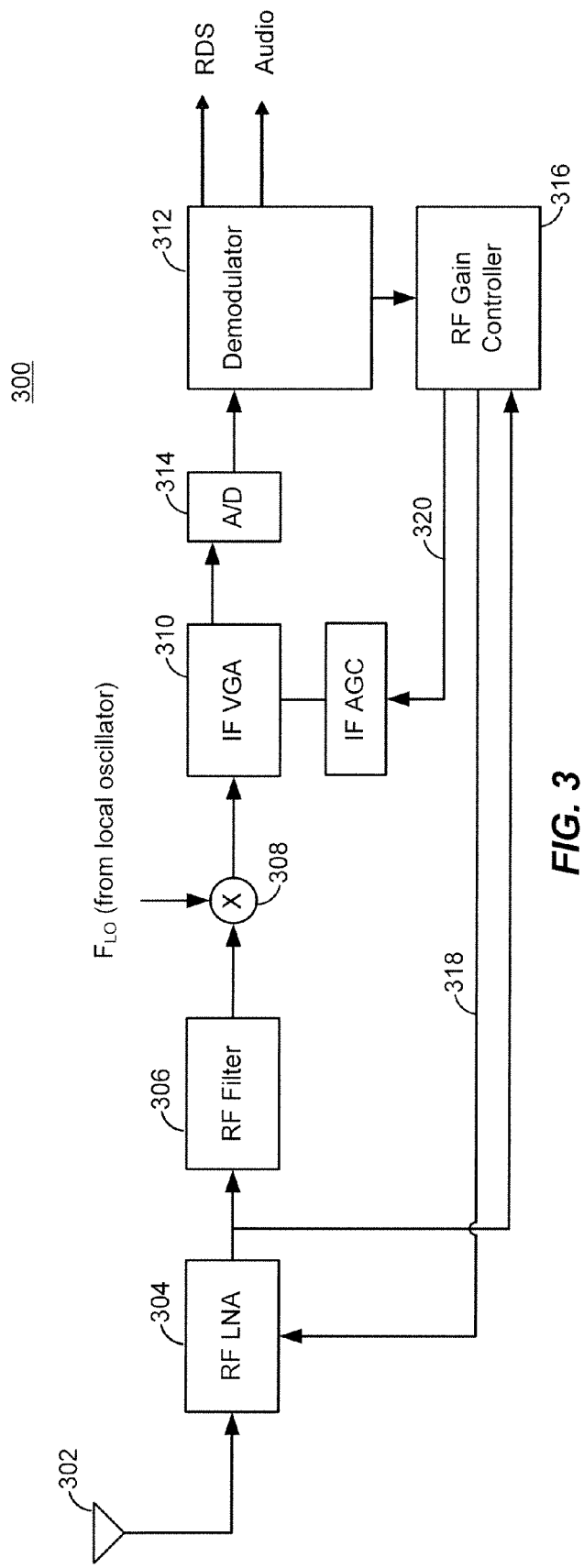
FIG. 3 is a block diagram of an example RF receiver having a RF gain controller to analyze the RF signal over the attack and decay modes.

FIG. 3 is a block diagram of an example RF receiver device 300. An antenna 302 couples an RF signal to a low noise amplifier (LNA) 304 that provides a controllable gain stage for the RF signal and then passes that RF signal to RF filter 306. A mixer 308 mixes the filtered RF signal with a local oscillator frequency, $F_{LO}$, to produce the IF signal which is passed to a variable gain amplifier (VGA) stage 310. The IF signal is then passed to a demodulator 312 that, in the FM radio application shown, produces a radio data system (RDS) signal and the audio signal corresponding to the in-band channel of the original RF transmitted signal. The illustrated demodulator 312 is a digital device; and, therefore, the IF signal is passed through an A/D converter 314 before demodulation.

In demodulating the IF signal, the system 300 uses a gain controller 316 to perform the attack and decay detection modes and to adjust gain of the LNA 304 and from the VGA 310 accordingly. The RF signal is coupled to the gain controller 316, and the demodulator 312 couples the receiver system clock to the gain controller 316. In turn, the gain controller 316 analyzes the received signal over attack and decay windows to determine if gain control signals (increasing gain or decreasing gain) should be communicated. A first control signal 318 controls the gain of the RE LNA 304; and a second control signal 320 controls the operation of the VGA 310 by communicating a blockout window status flag to an adjustable gain controller (AGC) 319. This configuration is provided by way of example. The gain controller 316 may control one or the other or both of the illustrated gain stages.

Although not illustrated, it will be appreciated that separate low pass filters may be used in the receiver 300, either separately or combined with the two gain stages. Other elements of a RF receiver not shown may also be apparent to persons of ordinary skill. Further still, beyond the descriptions provided herein, it will be appreciated by persons or ordinary skill that the elements listed may perform various other functions. For example, channel selection and bandgap filtering may be performed in the RF LNA 304, while in other examples channelization may be achieved entirely with the demodulator 312, or through the RF filter 306.

Figure 4:
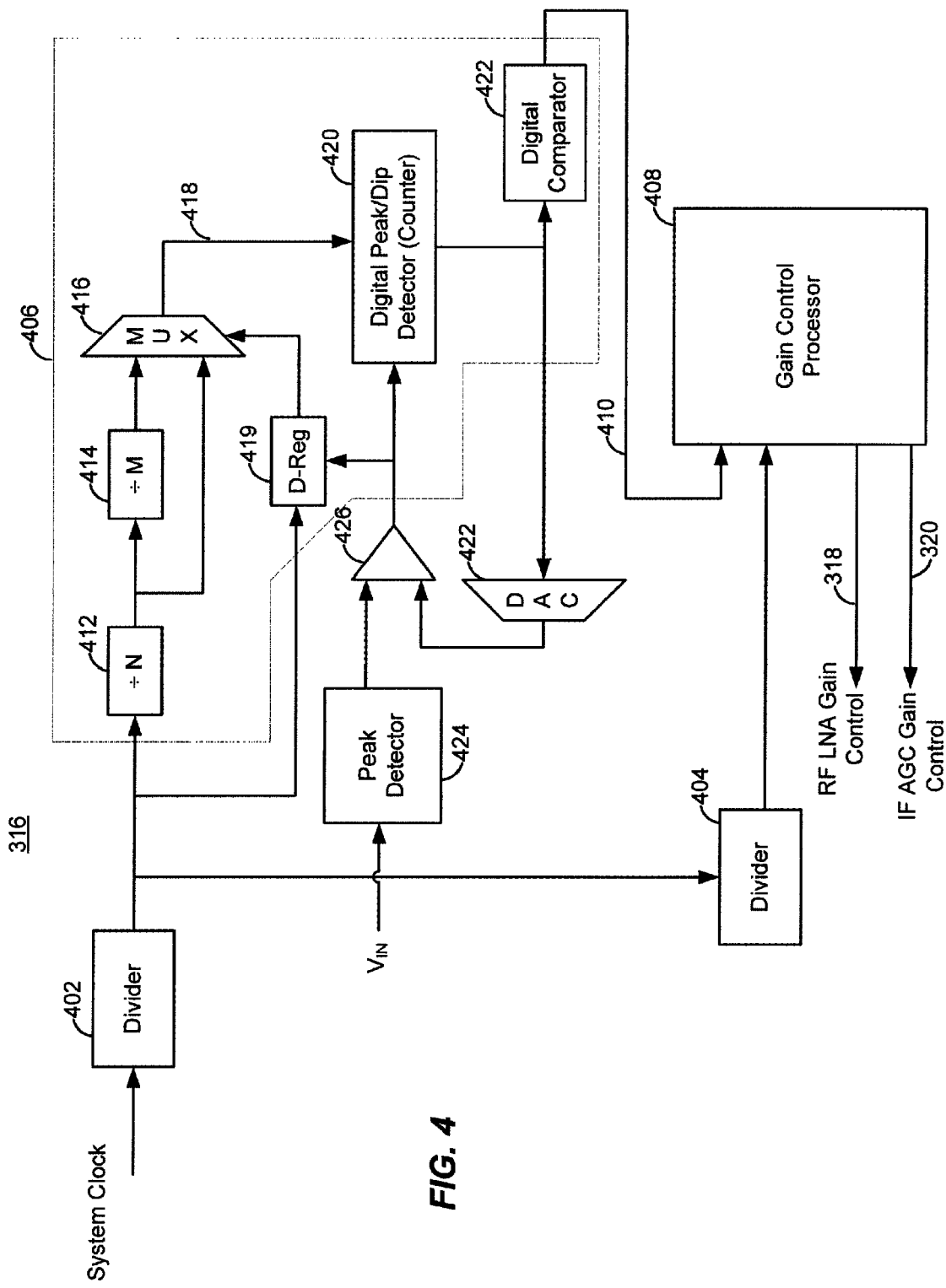
FIG. 4 is a block diagram of an example implementation of the RF gain controller of FIG. 3.

FIG. 4 is a block diagram of the gain controller 316. The system clock from the demodulator 312 is coupled to an optional divider 402 for clock division and then to a second optional divider stage 404 and to a counter stage 406. The divider 404 divides the clock further and provides the clock signal to a gain control processor 408 that operates as a digital control finite state machine producing the RF LNA control signal 318 and status flag signal 320. An example implementation of the gain control processor 408 is discussed with respect to FIG. 6.

The counter stage 406 receives the clock signal and the incoming RF signal (Vin) and in response produces a peak/dip detection signal 410 to the gain control processor 408.

In operation, the divider 402 couples the clock signal to a first divider 412, which acts as a fast counter control, and to a second divider 414, which acts as a slow counter control. That is, the dividers 412 and 414 may have different division ratios depending on the difference in desired window size between the attack window and the decay window. Counter control signals from each divider are coupled to a multiplexer 416 that produces a dynamic counter clock 418 that drives a counter by producing one of the fast or slow clock rates under the control of a delay register 419. As a result, a digital peak/dip detector 420 (e.g., a digital counter) identifies the peaks during a decay window and the dips during an attack window, and provides an output signal to a D/A converter (DAC) 422 in a feedback configuration.

An analog peak detector 424 produces a peak detection signal identify each peak and dip in the received signal, Vin. A comparator 426 compares this signal with a signal output from the counter 420, $V_{ref}$, after conversion by the DAC 422. The comparator 422 produces a logic high output when the peak detection signal is above the current counter value, which corresponds to an increase in RF signal strength. This value is provided to the digital peak/dip detector 420 and to the delay register 419 for controlling the mode of operation, attack (fast clock) or decay (slow clock).

A digital comparator 428 compares the detected from the detector 420 peaks against a high level threshold, $V_H$, and the dips against a low level threshold, $V_L$, and produces the detection signal 410. For example, the comparator 422 produces an attack detection signal when a detected dip is below the low threshold value, $V_L$, a decay detection signal when a detected peak is above a high threshold value, $V_H$, or a null value when neither values are beyond their respective thresholds. The comparator 428 may compare the detected values to predetermined thresholds, while in other examples, the threshold values may be set dynamically during operation. For example, the comparator 422 may sample the percentage of peaks/dips over a number of attack/decay windows and adjust the thresholds $V_H$ and $V_L$ if too many or too few of these detected values are occurring. In this way, the digital comparator 422 may be controlled to use the thresholds $V_H$ and $V_L$ to adjust the sensitivity of the system.

Figure 5:
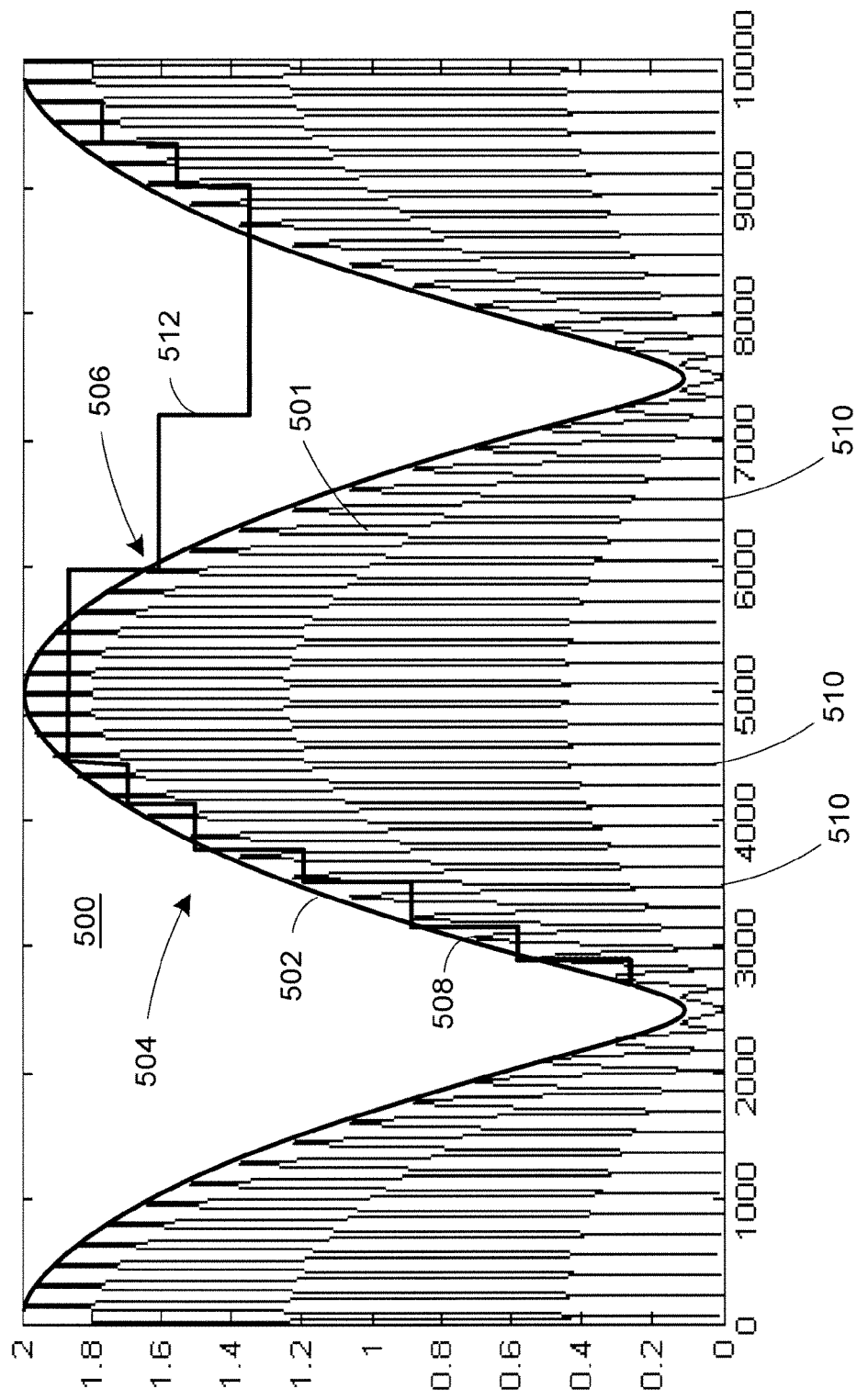
FIG. 5 is a plot of an RF signal and example resulting gain adjusted signal due to application of the attack and decay modes.

FIG. 5 illustrates an example operation of the counter stage 406 on an incoming RF signal 500. The signal 500 includes an interference envelope 502 at a carrier frequency induced by an interference and an in-band channel signal 501 modulated by that envelope 502. The signal 500 has a rising edge 504 and a falling edge 506, where in-band peaks increase over the rising edge 504 and decrease over the falling edge 506.

In an attack mode, the detector 420 uses the fast counter signal from divider 412 to detect the dips over an attack window, after which the comparator 422 determines if any of these dips 510 (only a few numbered) are below the low threshold. The gain controller 408 then determines whether to boost the gain to the LNA 304 by counting the number of low threshold dips over the allotted attack window time. In the decay mode, the detector 420 uses the slow counter signal from divider 414 to detect the peaks over a decay window, after which the comparator 422 determines if any of these peaks 508 (only a few numbered) are above the high threshold. The gain controller 408 then determines whether to decrease the gain to the LNA 304 by counting the number of high threshold peaks over the allotted decay window time. The system thus controls the gain profile such that the gain profile appears to be a re-shaped rendition of the in-band signal, with a faster response for controlling the rising edge 504 of the envelope and a slower, flatter response on the falling edge 506 to prevent the receiver from dropping gain too dramatically.

The attack and decay windows are assessed over the entire envelope 502, however, by using different high value ($V_H$) thresholds for peaks and different low value ($V_L$) thresholds for the dips. The result is that a gain profile 512 of the RF signal 500 will increase more rapidly as the signal strengths increase from a minimum of the envelope 502 and decrease more slowly as the signal strengths decrease from a maximum on the envelope 502.

Figure 6:
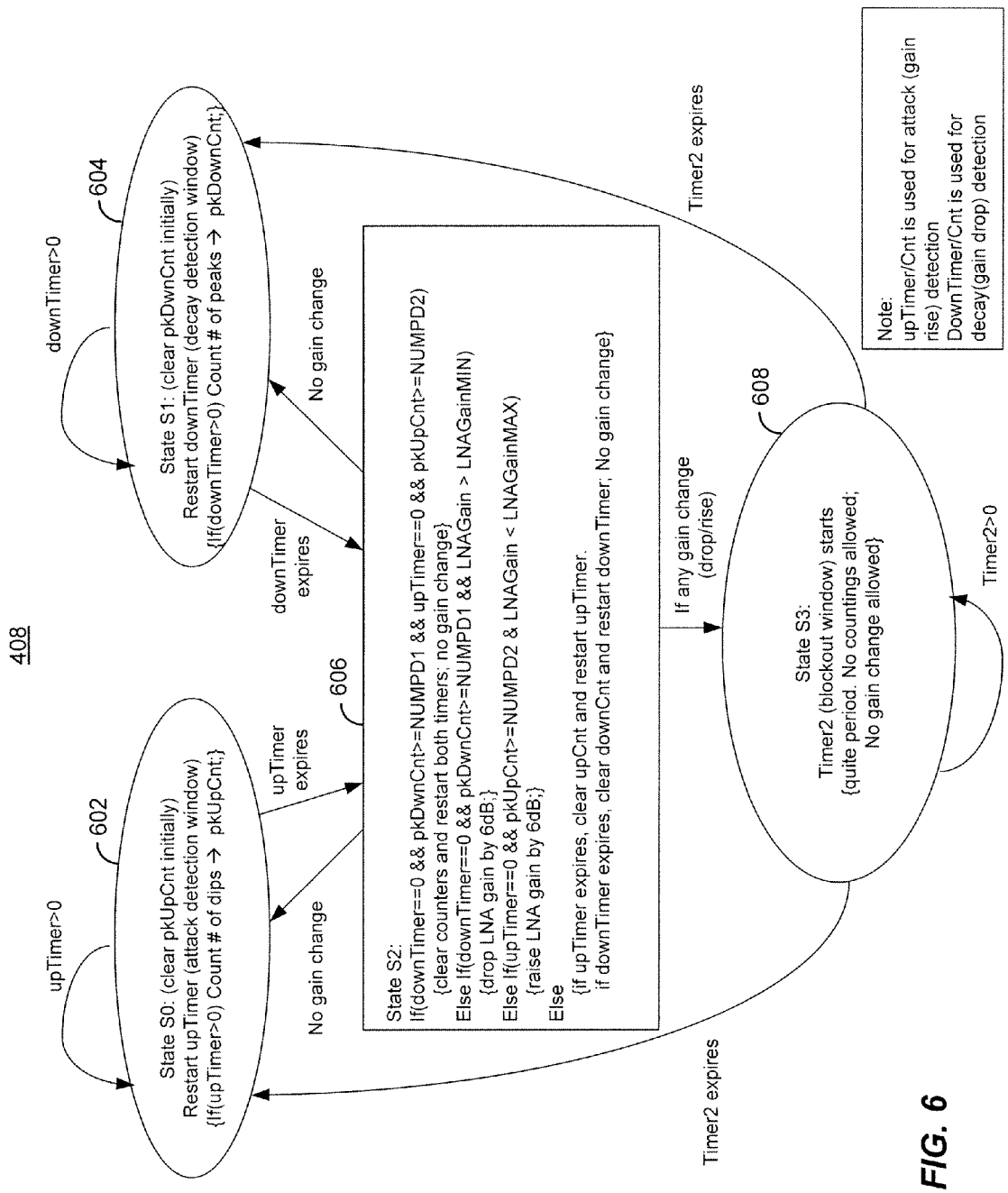
FIG. 6 is a state diagram of an example implementation of a gain control processor of FIG. 4.

FIG. 6 illustrates a state machine diagram of the operation of the gain control processor 408. In a state S0 602, the processor 408 starts an up timer for an attack detection window. If the up timer is greater than 0, then the number of low threshold dips received from the comparator 422 are counted, until the up timer (attack window) expires in which case control is passed to a block 606. In a state S1 604, the processor 408 starts a down timer for a decay detection window. If the down timer is greater than 0, then the number of high threshold peaks received from the comparator 422 are counted, until the down timer (decay window) expires in which case control is passed to a block 606.

The block 606 executes a state S2, where if the counted number of peaks (pkDwnCnt) from S1 is greater than a peak threshold (NUMPD 1) and the counted number of dips (pkUpCnt) is greater than a dip threshold (NUMPD2), then the counters are cleared and both the up timer (S0) and the down timer (S1) are restarted, without any change in gain. That is, the block 606 has identified a null condition when both the attack mode and the decay mode produce counter values above the respective thresholds.

If this null condition is not met, the block 606 next determines if the counted number of peaks is larger than the peak threshold number allotted to the decay window and if the gain of the LNA gain is greater than a gain minimum value. This would be a decay condition. If that is the case, the block 606 produces the signal 318 to instruct the RF LNA 304 to reduce the gain by a certain amount, e.g., 6 dB, due to the detection of a decay condition.

If there is no null condition and no decay condition, the block 606 next determines if the counted number of dips is larger than the dip threshold allotted to the attack window and if the LNA gain is less than a gain maximum value. This would be an attack condition. If that is the case, the block 606 produces the signal 318 to instruct the RF LNA 304 to increase the gain by a certain amount, e.g., 6 dB, due to the detection of an attack condition.

If neither a null condition, decay detection, nor attack detection occur, the block 606 will clear the timer count for the up timer, if it has expired, and separately clear the timer count of the down timer, if it has expired. The block 606 will restart each state S1 and S2, because the end of a detection window has been reached without the identification of a corresponding condition.

When the block 606 determines there is to be a gain change, either an increase or decrease, a signal is communicated to a state S3 block 608, which executes a blockout window timer in which the timers in states S1 and S2 are blocked from counting and no further gain change is allowed. The blockout windows 108 are thus used to allow the RF LNA 304 to respond to the control signal, while the gain control processor 408 is stopped from further analyzing the signal for gain control and the flag signal 320 is sent to the IF AGC 319 to prevent any further gain application or change in gain by the IF VGA 310. The size of the blockout window may be set to allow a settling time of the LNA 304.

The example of FIG. 6 is described in the context of controlling the RF LNA 304; however, the IF VGA 310 may be controlled in a similar manner. For example, the control signal 320 may provide a gain increase/decrease amount while the control signal 318 may include the status flag.

Furthermore, the processor 408 may operate by executing instructions stored internally or stored on another computer-readable medium. The described instructions may be modified as desired. For example, in the implementation of FIG. 6, the threshold amounts of low threshold dip values and high threshold peak values are compared to threshold numbers of dips/peaks over the respective analysis windows. However, the processor 408 may alternatively determine what percentage of dip values or peak values are beyond their respective thresholds and use this as the threshold amount determination. For example, as the detector 420 digitally identifies peaks and dips and communications those to the comparator 422, the comparator 422 may provide not only detection flag data indicating when a signal is beyond its respective threshold, but also a running tally of all detected peaks and dips. By passing along this data to the processor 408, the processor 408 may then determine what percentage of all peaks are above the high threshold ($V_H$) for peak values and what percentage of all dips are below the low threshold ($V_L$) for dip values.

FIGS. 7A-7E illustrate various simulations of RF gain simulation settings. For each example, a fading channel was created, using an STM two-ray channel with 5 Hz Doppler. Various signal patterns were used and antenna attenuation was included for the simulation.

Figure 7A:
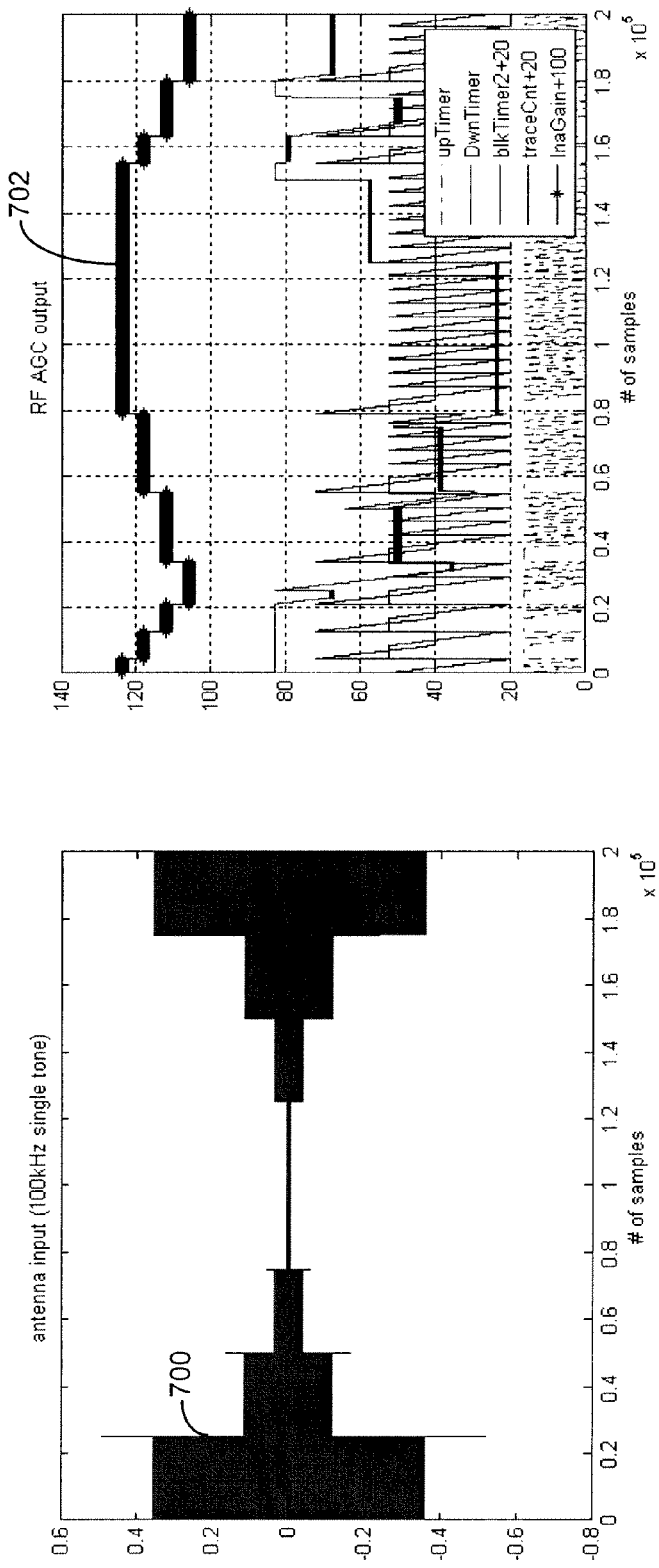
FIGS. 7A-7E illustrate plots of various simulations and resulting gain profiles on an RF gain stage as applied to different incoming RF signals.

FIG. 7A illustrates a first case in which a 100 kHz single tone RF signal has an abrupt gain change before fading by an amount of 10 dB/step. The signal is plotted in the left hand side plot. On the right hand side plot, the up timer and down timer values are shown, along with the block out timer renormalized by a value of 20, a trace counter renormalized by a value of 20, and the corresponding LNA gain values, normalized by a value of 100. The signal envelope 700 in this instance is discrete and stepwise. The LNA gain 702 shows a flatter profile than that of the single tone 700.

Figure 7B:
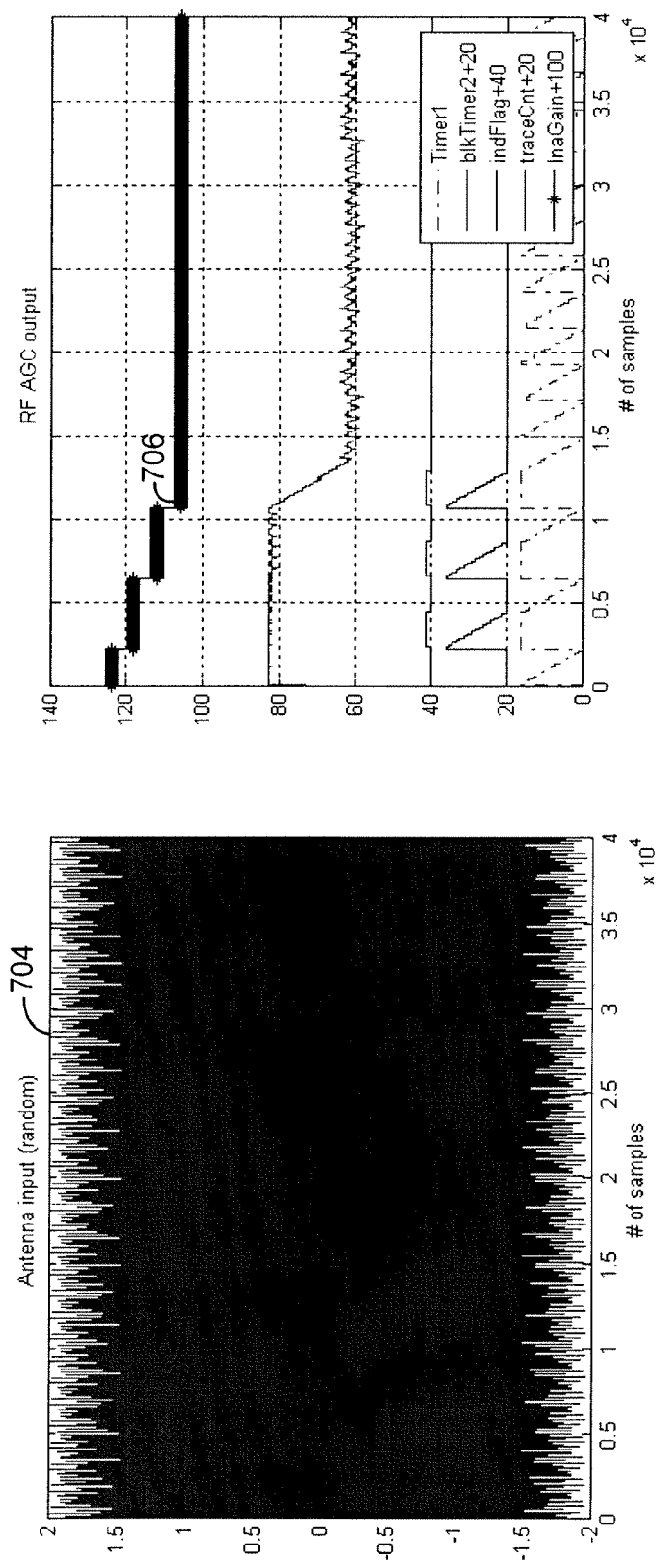

FIG. 7B illustrates a second case with random frequency RF signal 704 and with an LNA gain 706 that is substantially flat after an initial gain reduction region. Plotted in the right hand side are an up timer (Timer1), a blockout timer, trace counter, gain flag to indicate a blockout mode, and the LNA gain values.

Figure 7C:
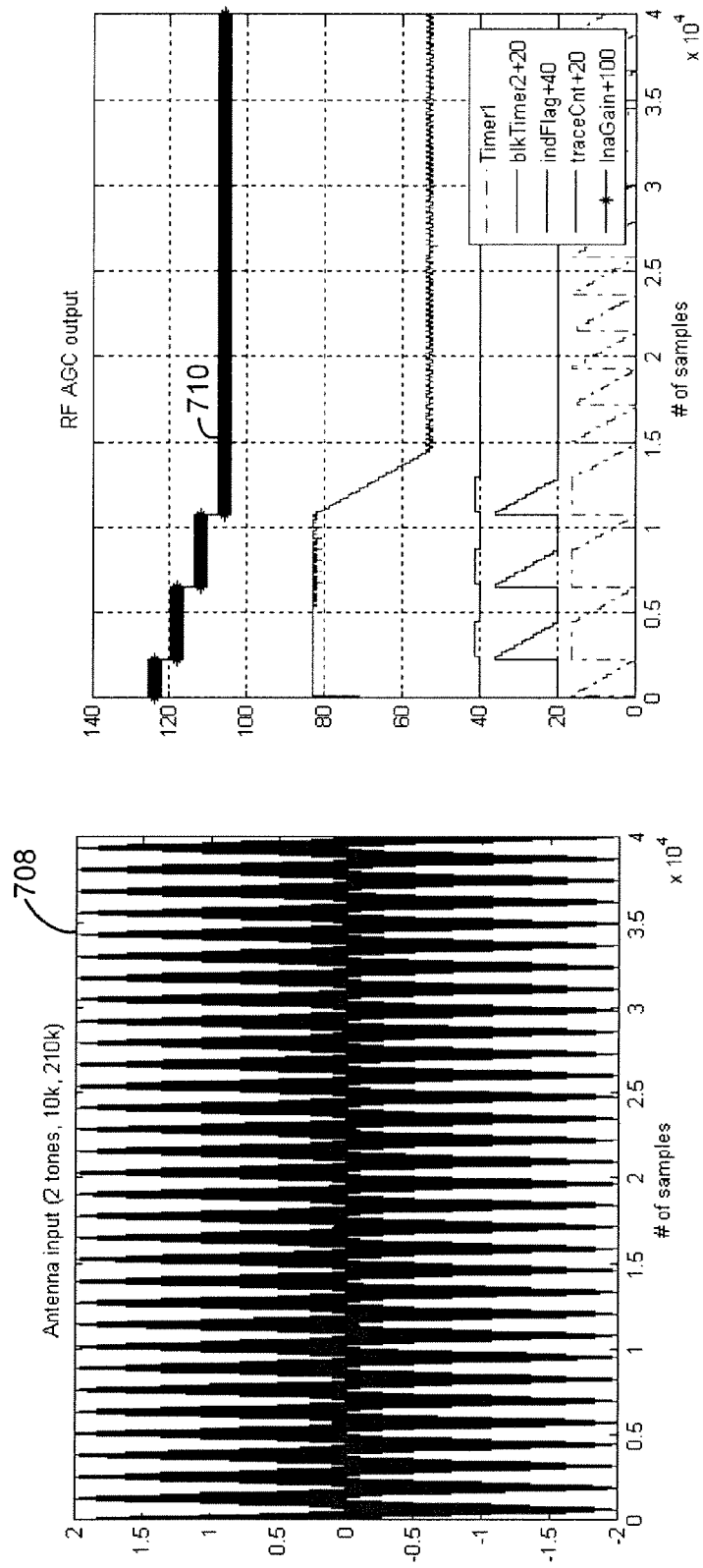

FIG. 7C illustrates a third case with two tones (10 kHz and 210 kHz) combined in the RF signal 708. The LNA gain 710 still responds the same as before, even though there is deep fading in the signal.

Figure 7D:
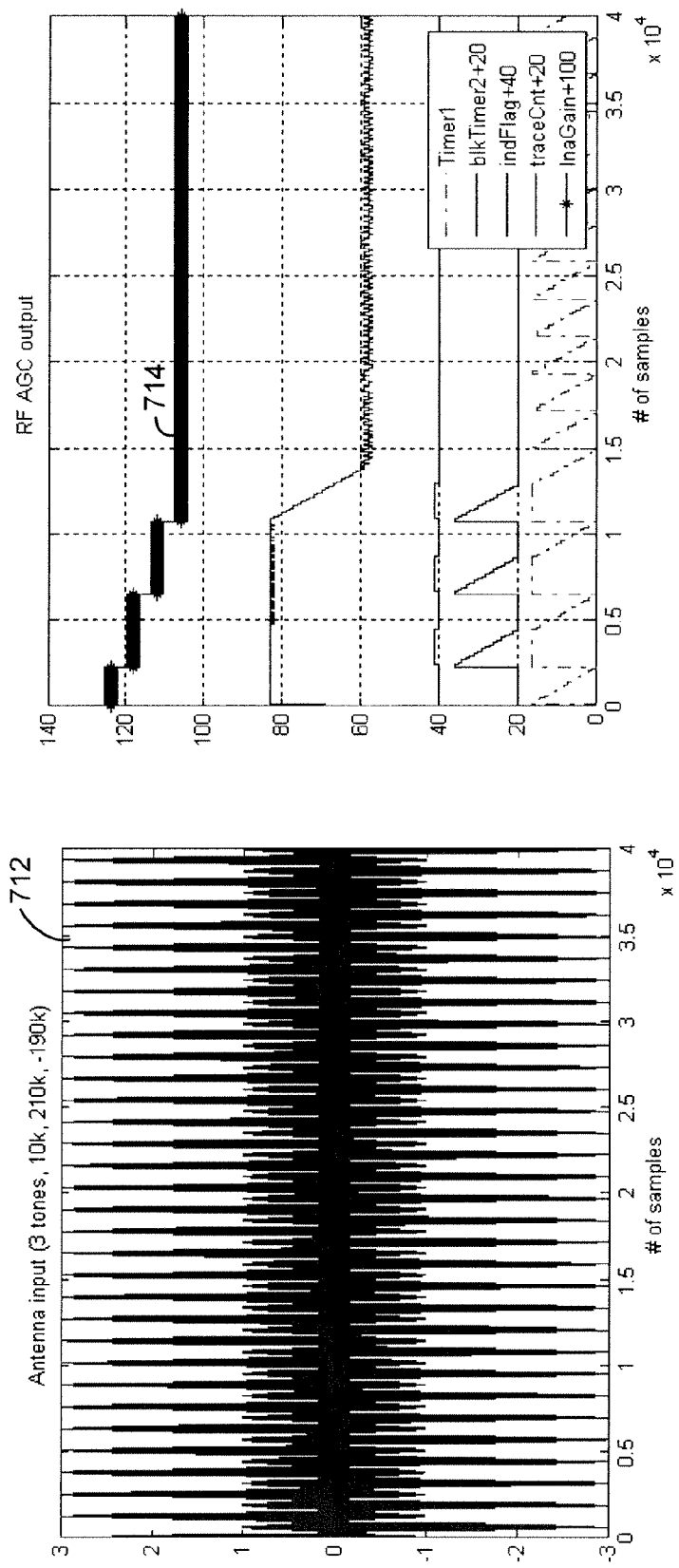

FIG. 7D illustrates the third case again but with three tones (10 kHz and 210 kHz, and 190 kHz) combined in the RF signal 712. The LNA gain 714 responds the same.

Figure 7E:
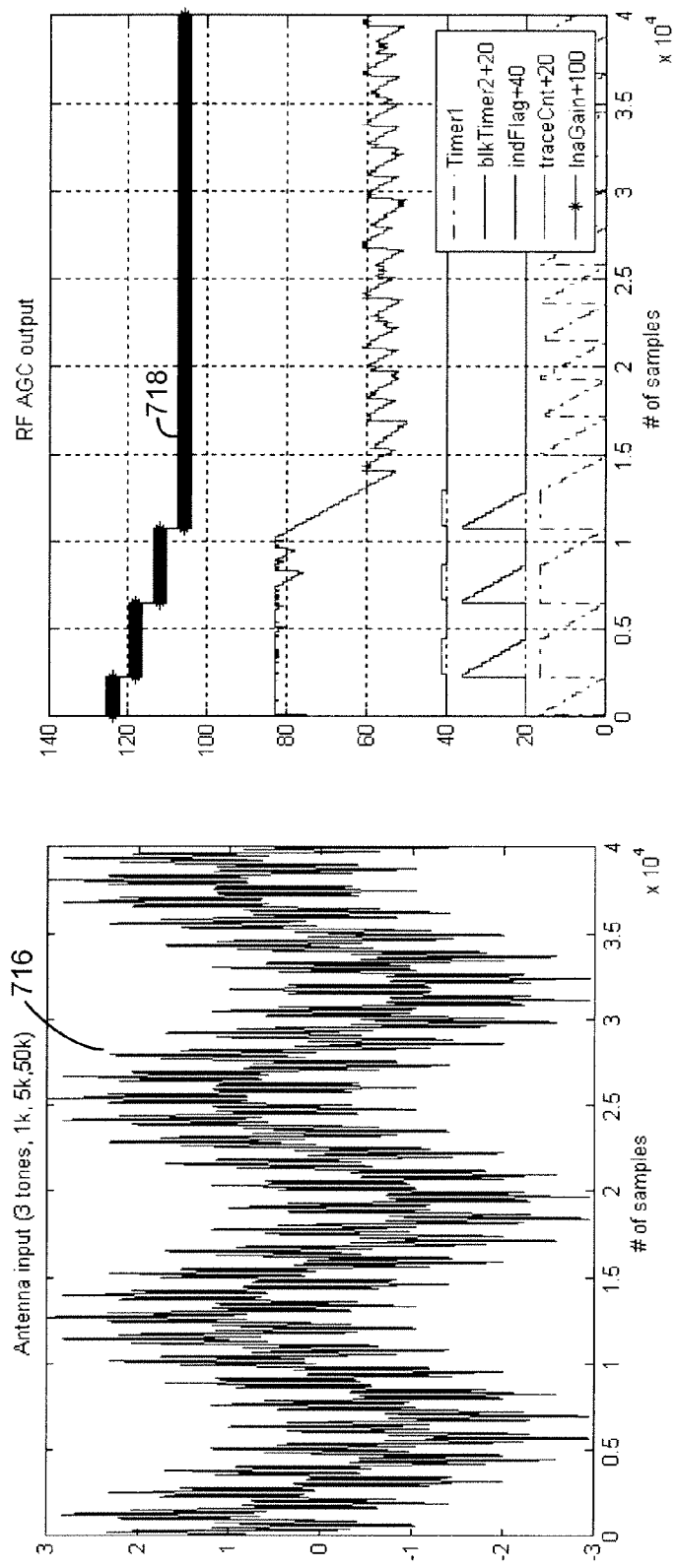

FIG. 7E illustrates a fourth case with three tones even closer together (1 kHz, 5 kHz, and 50 kHz) than those of FIG. 7D to form the RF signal 716. The LNA gain 718 is still a steady signal and does not respond to the vacillations in the RF signal.

Figure 8A:
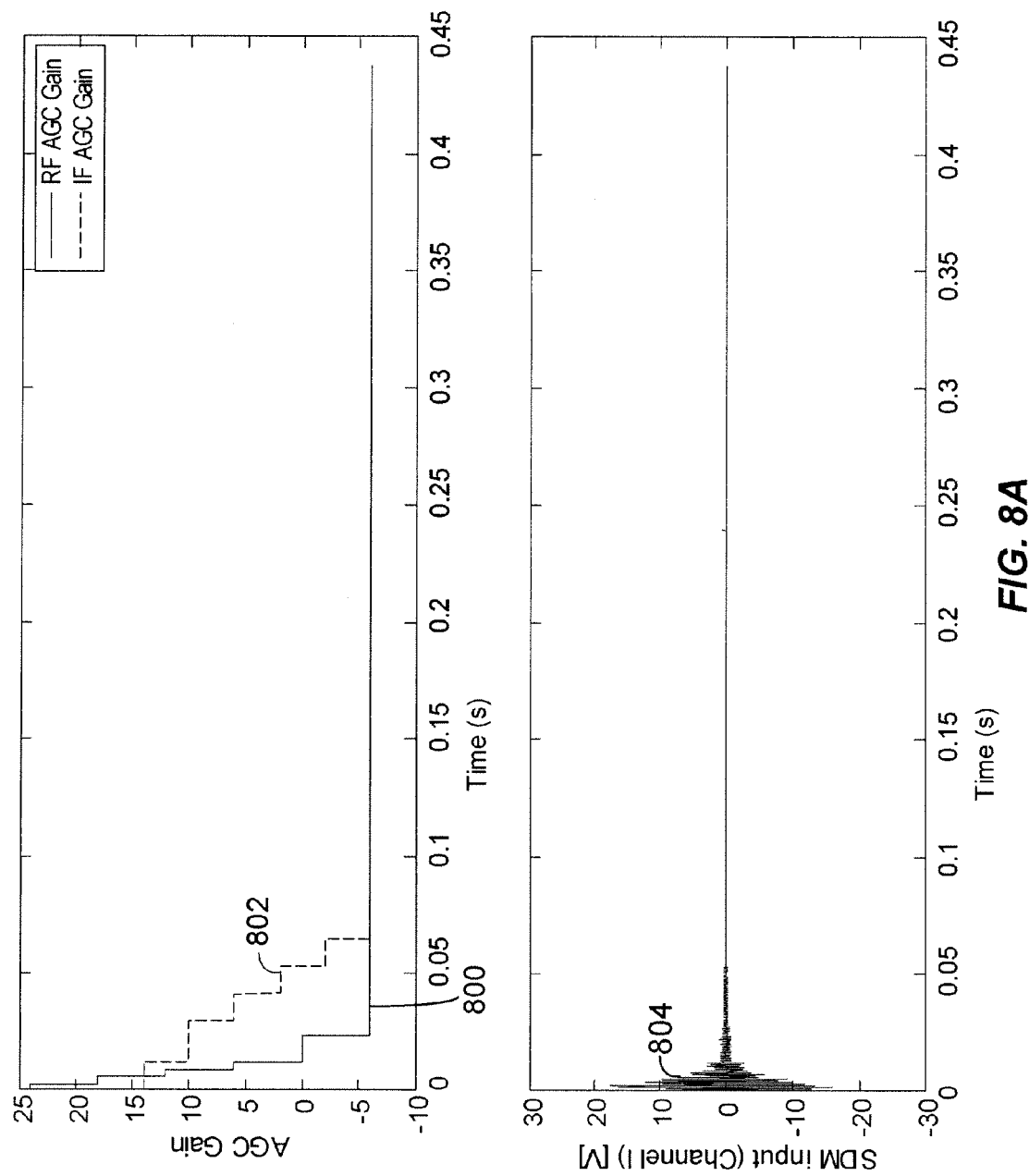
FIGS. 8A-8E illustrate plots of various simulations and resulting gain profiles on an RF gain stage and an intermediate frequency (IF) gain stage as applied to different incoming RF signals.
Figure 8B:
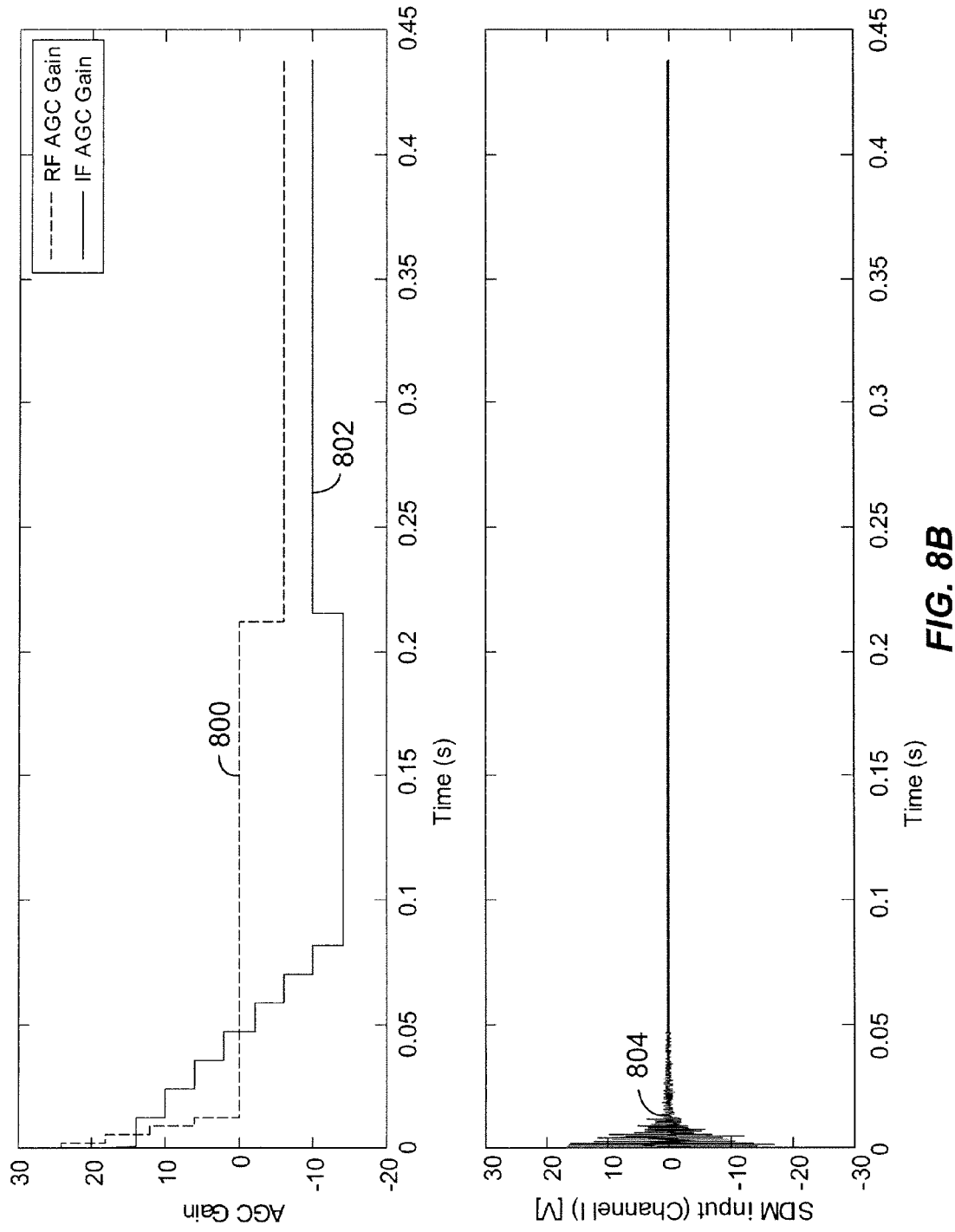
Figure 8C:
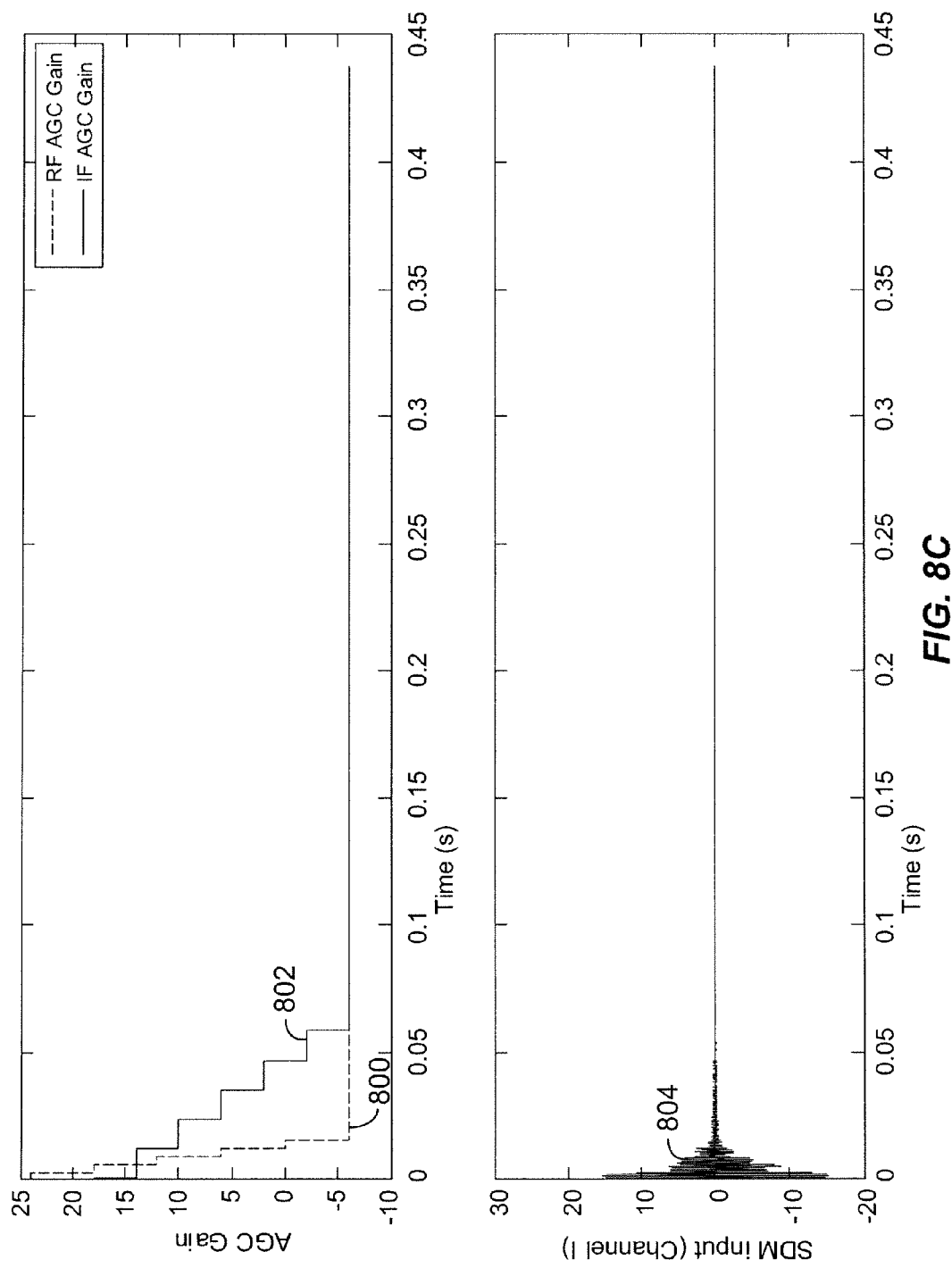

The examples of FIGS. 7A-7E involved controlling on the RF LNA gain. A series of system level simulations in which the gain of the IF VGA was also plotted are described with reference to FIGS. 8A-8F. The gain control simulation environment used a monaural (mono) input signal. For the fading channel, an STM channel with Doppler frequency of 5 Hz was used. The signal of interest (SOI) and adjacent channel interference (ACI) were of equal power. In simulation Case 1 (FIG. 8A), there was an ACI of equal power on one side of the STM channel spaced by 100 kHz; in Case 2 (FIG. 8B), there was an ACI of equal power on one side spaced at 200 kHz; in Case 3 (FIG. 8C), there were two ACIs of equal power one on each side of the STM channel both spaced at +/−100 kHz; and in Case 4 (FIG. 8D), there was no ACI but the input signal power changed with time. For FIG. 8E, the STM channel was combined with an ACI with one equal-power adjacent channel interference (ACI) at 200 kHz, but with higher power than 3 B. RF impairments were set to on; and the signal to noise ratio was 100 dB. A front end decorrelator was enabled, as well. The RF gain stage applied attack and decay modes using different parameters (window size, threshold, etc.). LNA saturation was added. The decay window was set to a value of 256 decay counts each at 10 µs. The attack window was set to a value of 128 attack counts each at 10 µs.

Figure 8D:
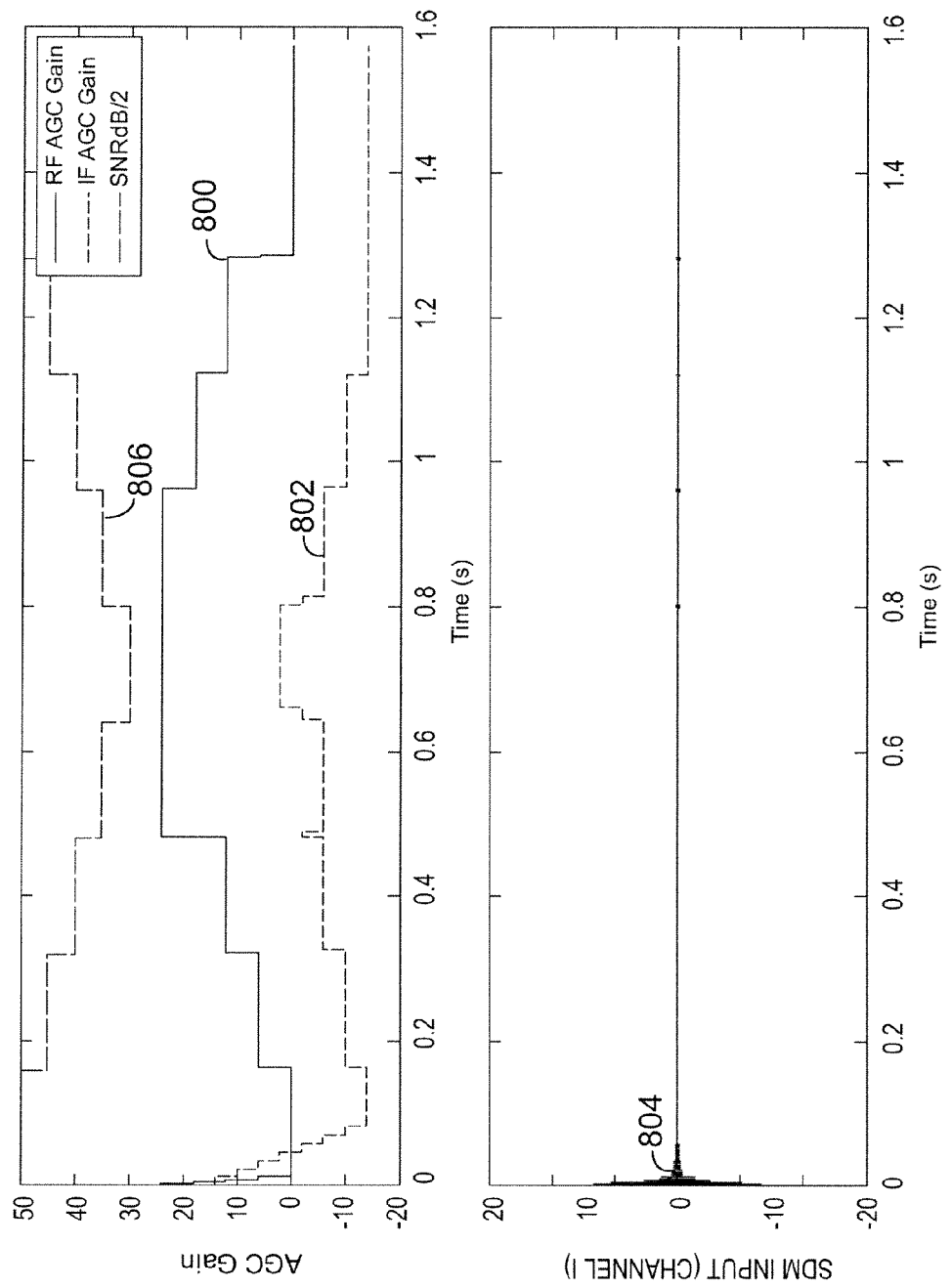
Figure 8E:
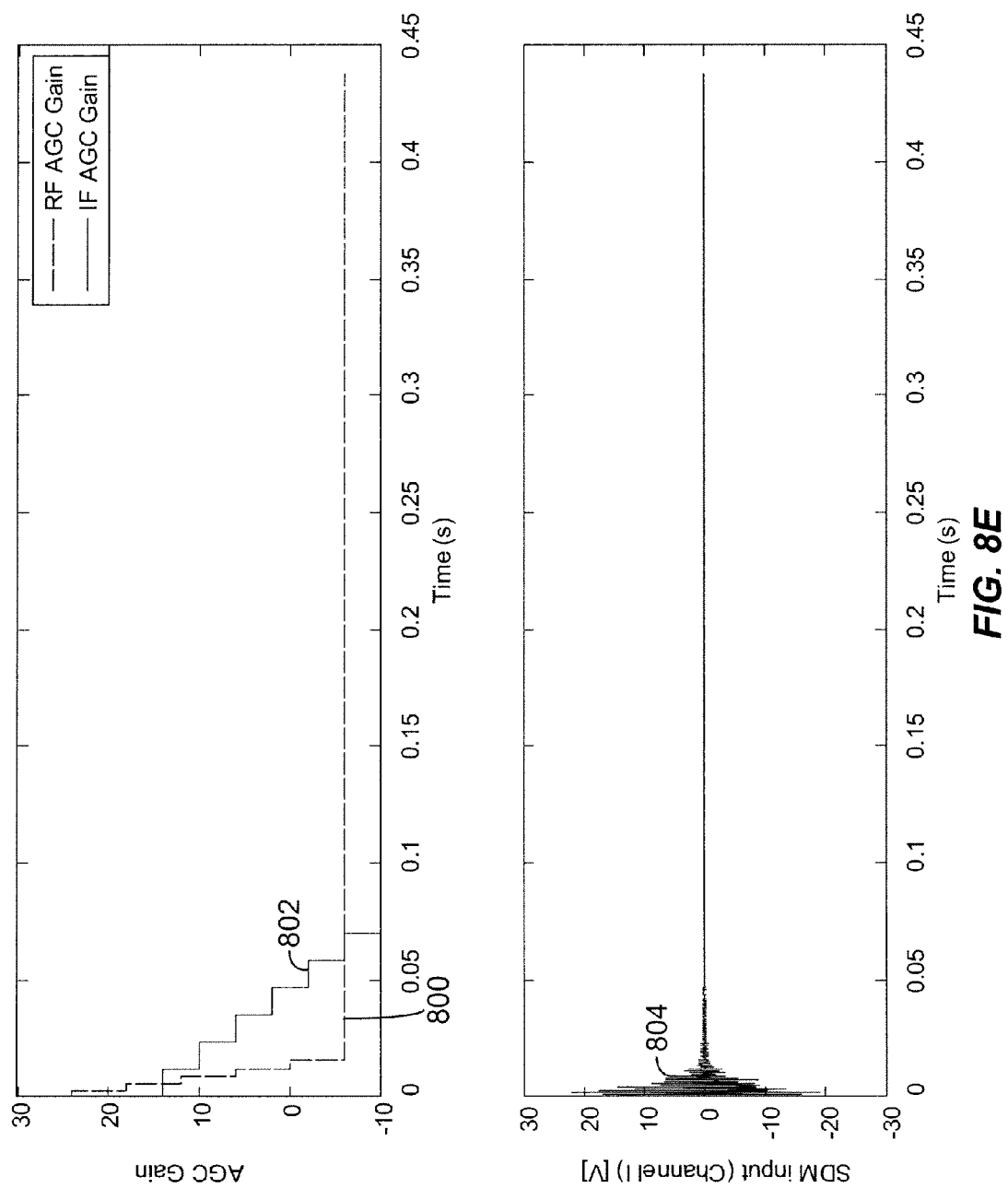

FIGS. 8A-8E illustrate applied gain values 800 for the RF AGC gain (e.g., the RF LNA 304) and applied gain values 802 for the IF VGA gain. The sigma delta modulator (SDM) input signal 804 is also shown. FIG. 8D, which has no ACI, but in which the transmitter power changed with time, further illustrates the S/N ratios 806 in dBs, and with a ½ conversion factor, for the transmitted RF signal. As can be seen from these examples, the gain control stabilizes thereby showing that the system is relatively insensitive to transients, such as channel interference and deep fading.

Figure 9A:
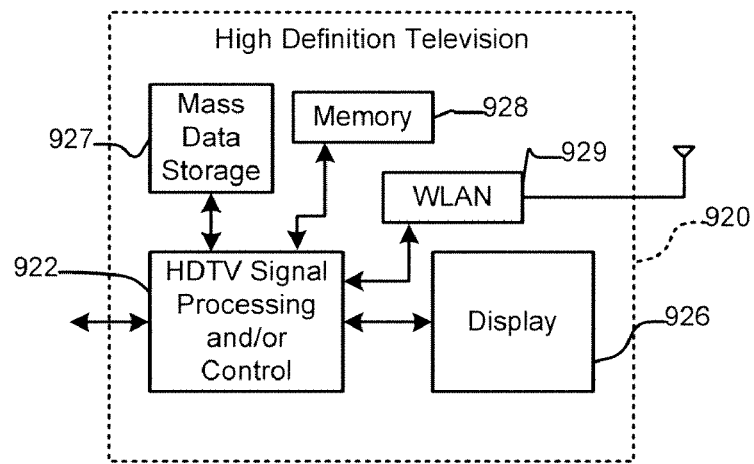
FIGS. 9A-9F illustrate embodiments of circuits that may incorporate a gain control system for controlling gain and reducing the effects of channel interference and deep fading.

Referring now to FIG. 9A, the RF gain techniques described herein may be utilized in a high definition television (HDTV) 920. HDTV 920 includes a mass data storage 927, an HDTV signal processing and control block 922, an RF wireless local area network (WLAN) interface and memory 928. HDTV 920 receives HDTV input signals in a wireless format and generates HDTV output signals for a display 926. In some implementations, signal processing circuit and/or control circuit 922 and/or other circuits (not shown) of HDTV 920 may process data, perform coding and/or encryption, perform calculations, format data and/or perform any other type of HDTV processing that may be required.

HDTV 920 may communicate with a mass data storage 927 that stores data in a nonvolatile manner such as optical and/or magnetic storage devices. The mass storage device may be a mini HDD that includes one or more platters having a diameter that is smaller than approximately 1.8". HDTV 920 may be connected to memory 928 such as RAM, ROM, low latency nonvolatile memory such as flash memory and/or other suitable electronic data storage. HDTV 920 also may support connections with a WLAN via a WLAN network interface 929. Both the HDTV signal processor 922 and the WLAN network interface 929 may include a gain control system as discussed herein.

Figure 9B:
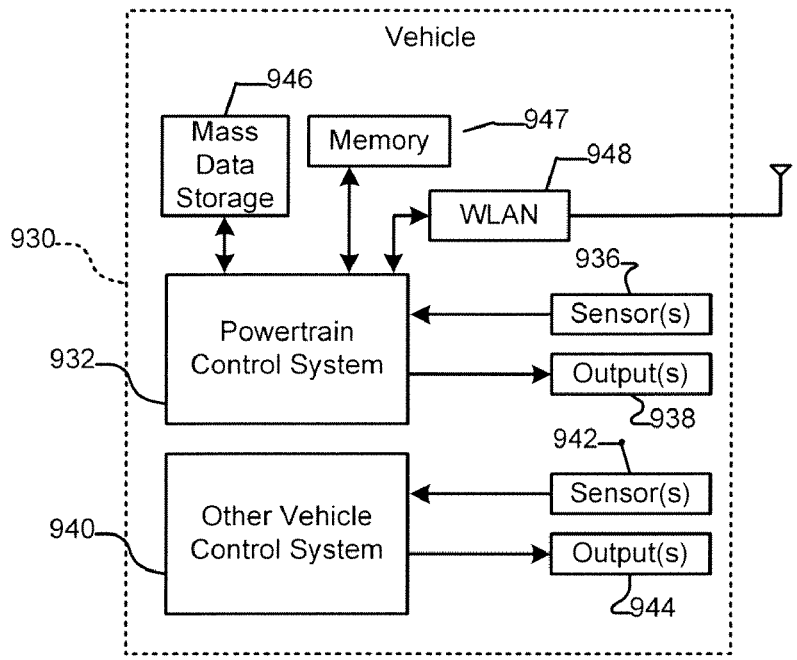

Referring now to FIG. 9B, such techniques may be utilized in a vehicle 930. The vehicle 930 includes a control system that may include mass data storage 946, as well as a WLAN interface 948. The mass data storage 946 may support a powertrain control system 932 that receives inputs from one or more sensors 936 such as temperature sensors, pressure sensors, rotational sensors, airflow sensors and/or any other suitable sensors and/or that generates one or more output control signals 938 such as engine operating parameters, transmission operating parameters, and/or other control signals.

Control system 940 may likewise receive signals from input sensors 942 and/or output control signals to one or more output devices 944. In some implementations, control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like.

Powertrain control system 932 may communicate with mass data storage 927 that stores data in a nonvolatile manner such as optical and/or magnetic storage devices. The mass storage device 946 may be a mini HDD that includes one or more platters having a diameter that is smaller than approximately 1.8". Powertrain control system 932 may be connected to memory 947 such as RAM, ROM, low latency nonvolatile memory such as flash memory and/or other suitable electronic data storage. Powertrain control system 932 also may support connections with a WLAN via a WLAN network interface 948. The control system 940 may also include mass data storage, memory and/or a WLAN interface (all not shown). In one exemplary embodiment, the WLAN network interface 948 may include a gain control system as discussed herein.

Figure 9C:
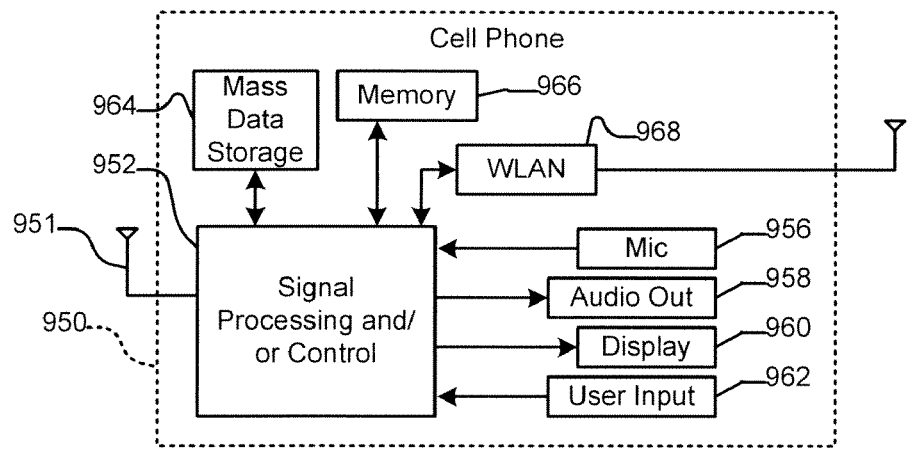

Referring now to FIG. 9C, such techniques may be used in a cellular phone 950 that may include a cellular antenna 951. The cellular phone 950 may include either or both signal processing and/or control circuits, which are generally identified in FIG. 9C at 952, a WLAN network interface 968 and/or mass data storage 964 of the cellular phone 950. In some implementations, cellular phone 950 includes a microphone 956, an audio output 958 such as a speaker and/or audio output jack, a display 960 and/or an input device 962 such as a keypad, pointing device, voice actuation and/or other input device. Signal processing and/or control circuits 952 and/or other circuits (not shown) in cellular phone 950 may process data, perform coding and/or encryption, perform calculations, format data and/or perform other cellular phone functions.

Cellular phone 950 may communicate with mass data storage 964 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 950 may be connected to memory 966 such as RAM, ROM, low latency nonvolatile memory such as flash memory and/or other suitable electronic data storage. Cellular phone 950 also may support connections with a WLAN via a WLAN network interface 968 that may include a gain control system as discussed herein.

Figure 9D:
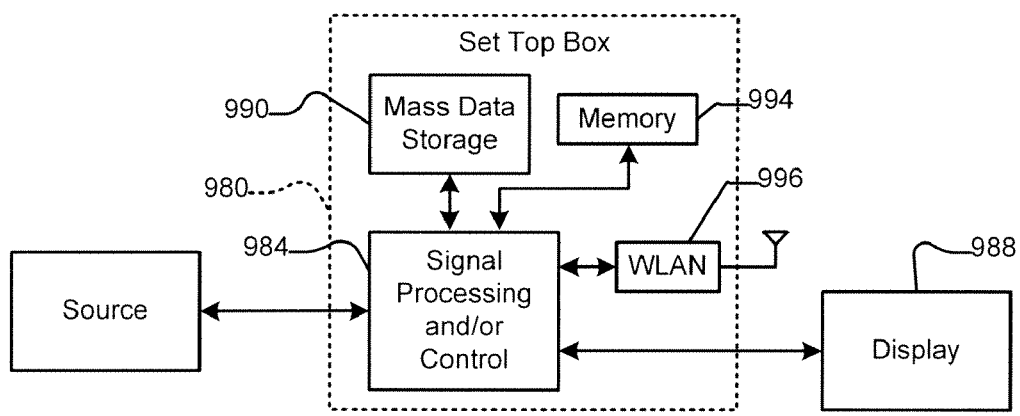

Referring now to FIG. 9D, such techniques may be utilized in a set top box 980. The set top box 980 may include either or both signal processing and/or control circuits, which are generally identified in FIG. 9D at 984, a WLAN interface and/or mass data storage 990 of the set top box 980. Set top box 980 receives signals from a source such as a broadband source and outputs standard and/or high definition audio/video signals suitable for a display 988 such as a television and/or monitor and/or other video and/or audio output devices. Signal processing and/or control circuits 984 and/or other circuits (not shown) of the set top box 980 may process data, perform coding and/or encryption, perform calculations, format data and/or perform any other set top box function.

Set top box 980 may communicate with mass data storage 990 that stores data in a nonvolatile manner and may use jitter measurement. Mass data storage 990 may include optical and/or magnetic storage devices for example hard disk drives HDD and/or DVDs. The HDD may be a mini HDD that includes one or more platters having a diameter that is smaller than approximately 1.8". Set top box 980 may be connected to memory 994 such as RAM, ROM, low latency nonvolatile memory such as flash memory and/or other suitable electronic data storage. Set top box 980 also may support connections with a WLAN via a WLAN network interface 996. The WLAN network interface 996 may include a gain control system as discussed herein.

Figure 9E:
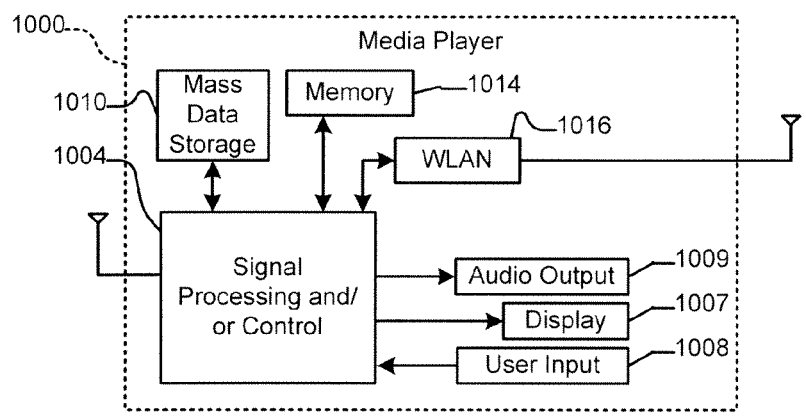

Referring now to FIG. 9E, such techniques may be used in a media player 1000. The media player 1000 may include either or both signal processing and/or control circuits, which are generally identified in FIG. 9E at 1004, a WLAN interface and/or mass data storage 1010 of the media player 1000. In some implementations, media player 1000 includes a display 1007 and/or a user input 1008 such as a keypad, touchpad and the like. In some implementations, media player 1000 may employ a graphical user interface (GUI) that typically employs menus, drop down menus, icons and/or a point-and-click interface via display 1007 and/or user input 1008. Media player 1000 further includes an audio output 1009 such as a speaker and/or audio output jack. Signal processing and/or control circuits 1004 and/or other circuits (not shown) of media player 1000 may process data, perform coding and/or encryption, perform calculations, format data and/or perform any other media player function.

Media player 1000 may communicate with mass data storage 1010 that stores data such as compressed audio and/or video content in a nonvolatile manner and may utilize jitter measurement. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 1000 may be connected to memory 1014 such as RAM, ROM, low latency nonvolatile memory such as flash memory and/or other suitable electronic data storage. Media player 1000 also may support connections with a WLAN via a WLAN network interface 1016. The WLAN network interface 1016 and/or signal processing circuits 1004 may include a gain control system as discussed herein.

Figure 9F:
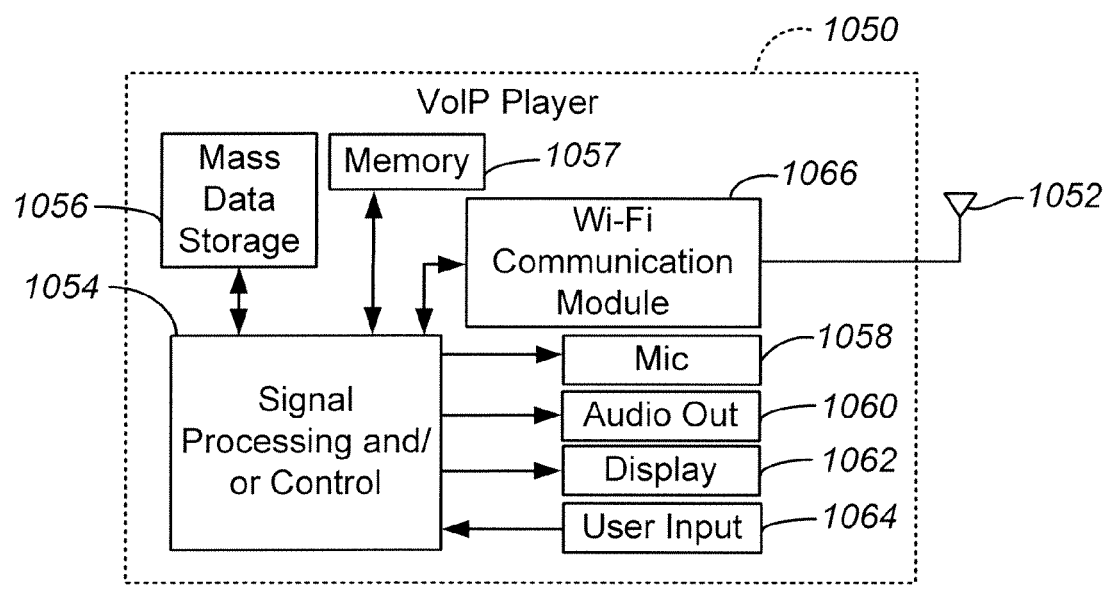

Referring to FIG. 9F, such techniques may be utilized in a Voice over Internet Protocol (VoIP) phone 1050 that may include an antenna 1052. The VoIP phone 1050 may include either or both signal processing and/or control circuits, which are generally identified in FIG. 9F at 1054, a wireless interface and/or mass data storage of the VoIP phone 1050. In some implementations, VoIP phone 1050 includes, in part, a microphone 1058, an audio output 1060 such as a speaker and/or audio output jack, a display monitor 1062, an input device 1064 such as a keypad, pointing device, voice actuation and/or other input devices, and a Wireless Fidelity (WiFi) communication module 1066. Signal processing and/or control circuits 1054 and/or other circuits (not shown) in VoIP phone 1050 may process data, perform coding and/or encryption, perform calculations, format data and/or perform other VoIP phone functions.

VoIP phone 1050 may communicate with mass data storage 1056 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 1050 may be connected to memory 1057, which may be a RAM, ROM, low latency nonvolatile memory such as flash memory and/or other suitable electronic data storage. VoIP phone 1050 is configured to establish communications link with a VoIP network (not shown) via WiFi communication module 1066. The WiFi communication module 1066 include a gain control system as discussed herein for use in communicating data via the WiFi communication module 1066 or via the audio output 1060 in communication with an accessory, such as a Bluetooth headset (not depicted).

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method for adjusting gain in a receiver receiving a signal, the method comprising:
    analyzing the signal over a first detection window of time to determine if a threshold amount of peak values in the signal occur during the first detection window;
    analyzing the signal over a second detection window of time to determine if a threshold amount of dip values in the signal occur during the second detection window, wherein the first detection window and the second detection window have different lengths; and
    adjusting the gain applied to the signal in response to the determination of the threshold amount of peak values occurring during the first detection window or the determination of the threshold amount of dip values occurring during the second detection window.

2. The method of claim 1, further comprising:
    increasing the gain applied in response to the identification of the threshold amount of dip values occurring in the second detection window; and
    decreasing the gain applied in response to the identification of the threshold amount of peak values occurring in the first detection window.

3. The method of claim 1, wherein the first detection window is a decay window, and the second detection window is an attack window that is shorter than the decay window, the method further comprising determining if the signal is in an attack condition or if the signal is in a decay condition.

4. The method of claim 3, further comprising:
    analyzing the signal over the attack window during a rising edge portion of an interference envelope of the signal; and
    analyzing the signal over the decay window during a falling edge portion of the interference envelope.

5. The method of claim 4, further comprising adjusting the gain by increasing the gain during the rising edge portion at a first rate and decreasing the gain during the falling edge portion at a second rate that is slower than the first rate.

6. The method of claim 3, wherein the threshold amount of peak values is a threshold percentage of peak values occurring in the first detection window, and wherein the threshold amount of dip values is a threshold percentage of dip values occurring in the second detection window.

7. The method of claim 3, wherein the threshold amount of peak values is a threshold number of peak values occurring in the first detection window, and wherein the threshold amount of dip values is a threshold number of dip values occurring in the second detection window.

8. The method of claim 3, further comprising entering a blockout window if it is determined that the signal is in the attack condition or in the decay condition, wherein continued analysis of the signal over the first detection window and continued analysis of the signal over the second detection window is blocked during the blockout window.

9. The method of claim 8, further comprising:
    determining if the signal is simultaneously in an attack condition and in the decay condition; and
    in response to the determination, restarting the analysis of the signal over the attack window and restarting the analysis of the signal over the decay window, without entering the blockout window and without increasing or decreasing the gain applied.

10. The method of claim 1, wherein the first detection window and the second detection window are not synchronized.

11. The method of claim 1, further comprising:
    detecting the peak values over the first detection window and detecting the dip values over the second detection window using a digital detector; and
    controlling a clock signal supplied to the digital detector by controlling the output of a multiplexer receiving a first clock signal and a second clock signal slower than the first clock signal.

12. The method of claim 11, further comprising:
    converting an output of the digital detector to an analog reference value; and
    comparing the analog reference value with an analog peak detection value or an analog dip detection value.

13. The method of claim 12, further comprising controlling the output of the multiplexer in response to the comparison of the analog reference value with the analog peak detection value or the analog dip detection value.

14. The method of claim 1, wherein analyzing the signal over the first detection window further comprises:
    identifying the number of peak values of the signal that are above a high-level threshold; and
    determining whether the threshold number of the peak values above the high-level threshold occur during the first detection window.

15. The method of claim 1, wherein analyzing the signal over the second detection window further comprises:
    identifying the number of dip values of the signal that are below a low-level threshold; and determining whether the threshold number of the dip values below the low-level threshold occur during the second detection window.

16. An apparatus for controlling gain in a receiver, the apparatus comprising:
a digital counter stage to detect peak values over a first detection window of time and to detect dip values over a second detection window of time, wherein the first detection window and the second detection window have different lengths;
a digital comparator to identify when a detected peak value is higher than a high-level threshold and to identify when a detected dip value is below is a low-level threshold; and
a gain control unit to control the gain applied to the signal in response to a determination that a threshold amount of the detected peak values higher than the high-level threshold has occurred over the first detection window and in response to a determination that a threshold amount of the detected dip values lower than the low-level threshold has occurred over the second detection window.

17. The apparatus of claim 16, the digital counter stage comprising:
a digital detector;
a multiplexer to provide a dynamic clock signal to the digital detector, the dynamic clock signal selectively having a first clock rate or a second clock rate slower than the first clock rate; and
a delay register to control the multiplexer to provide one of the first clock rate or the second clock rate as the dynamic clock signal from the multiplexer, wherein the digital detector detects the peak values and the dip values at the rate of the dynamic clock.

18. The apparatus of claim 17, the digital counter stage further comprising:
a fast clock divider to produce the first clock rate to the multiplexer; and
a slow clock divider to produce the second clock rate to the multiplexer.

19. The apparatus of claim 17, further comprising a digital to analog converter to convert an output of the digital detector to an analog reference value for comparison with an analog peak detection value of the signal and with an analog dip detection value of the signal.

20. The apparatus of claim 16, wherein the gain control unit comprises:
a processor; and
a computer-readable medium having computer-executable instructions that, when executed, cause the processor to:
a) determine if the signal is in an attack condition in which the threshold amount of the detected dip values lower than the low-level threshold has occurred during the second detection window; and
b) determine if the signal is in a decay condition in which the threshold amount of the detected peak values higher than the high-level threshold has occurred during the first detection window.

21. The apparatus of claim 20, wherein the computer-readable medium has further computer-executable instructions that, when executed, cause the processor to:
increase the gain applied to the signal if the attack condition has been determined; and
decrease the gain applied to the signal if the decay condition has been determined.

22. The apparatus of claim 21, wherein the computer-readable medium has further computer-executable instructions that, when executed, cause the processor to enter a blockout window if the gain applied to the signal is to be increased or decreased.

23. The apparatus of claim 21, wherein the computer-readable medium has further computer-executable instructions that, when executed, cause the processor to repeat a) and b), without increasing or decreasing the gain applied, if it is determined that the signal is simultaneously in both the attack condition and the decay condition.

24. An RF receiver configured to receive a Radio Frequency (RF) signal, said RF receiver comprising:
a RF low noise amplifier to apply gain to the RF signal;
an analog signal detector to provide analog peak values and analog dip values of the RF signal;
a digital counter stage to determine digital peak values over a first detection window of time and to determine digital dip values over a second detection window of time, wherein the first detection window and the second detection window have different lengths;
a digital comparator to identify digital peak values above a high-level threshold and to identify digital dip values below a low-level threshold; and
a gain control unit to control the gain applied by the RF low noise amplifier in response to a determination that a threshold amount of digital peak values are higher than the high-level threshold over the first detection window and to a determination that a threshold amount of digital dip values are lower than the low-level threshold over the second detection window.

25. The RF receiver of claim 24, further comprising:
a digital-to-analog converter to covert an output from the digital counter stage to an analog reference value; and
an analog comparator to compare the analog peak values and the analog dip values to the analog reference value.

26. The RF receiver of claim 25, the digital counter stage comprising:
a digital detector to determine the digital peak values from the analog peak values and to determine the digital dip values from the analog dip values;
a multiplexer to provide a dynamic clock signal to the digital detector, the dynamic clock signal selectively having a first clock rate or a second clock rate slower than the first clock rate; and
a delay register to control the multiplexer to provide one of the first clock rate or the second clock rate as the dynamic clock signal from the multiplexer.

27. The RF receiver of claim 26, the digital counter stage comprising:
a fast clock divider to produce the first clock rate to the multiplexer; and
a slow clock divider to produce the second clock rate to the multiplexer.

28. The RF receiver of claim 24, further comprising:
a mixer to convert the RF signal to an intermediate frequency (IF) signal;
a variable gain amplifier to apply a gain to the IF signal; and
an adjustable gain controller to control operation of the variable gain amplifier.

29. The RF receiver of claim 28, further comprising a RF demodulator to demodulate a RF channel of the RF signal.

30. The RF receiver of claim 28, wherein the gain control unit comprises:
a processor; and
a computer-readable medium having computer-executable instructions that, when executed, cause the processor to:

a) determine if the threshold amount of digital dip values lower than the low-level threshold has occurred during the second detection window; and b) determine if the threshold amount of digital peak values higher than the high-level threshold has occurred during the first detection window.

31. The RF receiver of claim 30, wherein the computer-readable medium has further computer-executable instructions that, when executed, cause the processor to:

increase the gain applied by the RF low noise amplifier if the threshold amount of digital dip values lower than the low-level threshold has occurred during the second detection window; and decrease the gain applied by the RF low noise amplifier if the threshold amount of digital peak values higher than the high-level threshold has occurred during the first detection window.

32. The RF receiver of claim 30, wherein the computer-readable medium has further computer-executable instructions that, when executed, cause the processor to:

enter a blockout window if the gain applied to the signal is to be increased or decreased; and send a blockout window status flag to the adjustable gain controller to stop the variable gain amplifier from decreasing or increasing the gain applied to the IF signal during the blockout window.

33. The RF receiver of claim 30, wherein the computer-readable medium has further computer-executable instructions that, when executed, cause the processor to:

enter a blockout window if the gain applied to the signal is to be increased or decreased; and send a blockout window status flag to the adjustable gain controller to stop the variable gain amplifier from applying the gain to the IF signal during the blockout window.

34. The RF receiver of claim 30, wherein the computer-readable medium has further computer-executable instructions that, when executed, cause the processor to repeat a) and b), without increasing or decreasing the gain applied, if it is determined that simultaneously (1) the threshold amount of digital dip values lower than the low-level threshold has occurred during the second detection window and (2) the threshold amount of digital peak values higher than the high-level threshold has occurred during the first detection window.

* * * * *